(12) United States Patent
Gailhard et al.

(10) Patent No.: US 6,731,178 B2
(45) Date of Patent: May 4, 2004

(54) PRECISE DIGITAL GENERATOR PRODUCING CLOCK SIGNALS

(75) Inventors: Bruno Gailhard, Trets (FR); Olivier Ferrand, Puyloubier (FR)

(73) Assignee: STMicroelectronics SA, Montrouge (FR)

( * ) Notice: Subject to any disclaimer, the term of this patent is extended or adjusted under 35 U.S.C. 154(b) by 155 days.

(21) Appl. No.: 10/021,282

(22) Filed: Oct. 30, 2001

(65) Prior Publication Data

US 2002/0109554 A1 Aug. 15, 2002

(30) Foreign Application Priority Data

Oct. 30, 2000 (FR) .............................. 00 13895

(51) Int. Cl.[7] ................................. H03B 5/02
(52) U.S. Cl. ...................... 331/57; 331/1 A; 331/25; 327/156; 327/158; 327/159; 375/376
(58) Field of Search ................. 331/57, 1 A, 25; 327/156, 158, 159; 375/376

(56) References Cited

U.S. PATENT DOCUMENTS 5,490,182 A * 2/1996 Arai .................... 375/376
5,903,521 A    5/1999 Relph .................. 368/113
5,923,715 A    7/1999 Ono .................... 375/376

FOREIGN PATENT DOCUMENTS

EP    0657796    6/1995    ............. G06F/1/08

* cited by examiner

*Primary Examiner*—Arnold Kinkead
(74) *Attorney, Agent, or Firm*—Allen, Dyer, Doppelt, Milbrath & Gilchrist, P.A.; Lisa K. Jorgenson

(57) ABSTRACT

A generator includes an oscillator for producing a clock signal from an N-bit control number. The oscillator includes a first group of cells, with each cell including at least one series connected inverter. A first selection circuit selects a variable number of the cells as a function of the most significant bits of the control number. The oscillator also includes a second group of cells, with each cell including at least one series connected inverter. A second selection circuit selects one of the cells as a function of the least significant bits of the control number. The selected cells of the first and second groups of cells are series connected to form a chain of inverters.

36 Claims, 3 Drawing Sheets

PRECISE DIGITAL GENERATOR PRODUCING CLOCK SIGNALS

FIELD OF THE INVENTION

The invention relates to phase-locked loop type clock-signal generators that produce a high-frequency clock signal from a low-frequency clock signal. Among these generators, the invention relates more specifically to those using a digital oscillator producing clock signals whose period is proportional to a binary number received by the oscillator.

BACKGROUND OF THE INVENTION

A prior art generator 10 of this kind, as illustrated in FIG. 1, has a comparator 12 and a digital oscillator 20 connected in series. An output OUT of the oscillator 20 is connected to an input of the comparator 12. The generator 10 gives a high-frequency signal CKHF (with a period PHF) from a low-frequency reference signal CKBF (with a period PBF).

The comparator 12 has two inputs to which the high-frequency signal CKHF and the low-frequency reference signal CKBF are applied. The comparator 12 compares the period PHF of the high-frequency signal CKHF with a desired period PHF0. The desired period is, for example, a multiple of the period PBF. The comparator 12 produces a number NR of N0 bits having the following characteristics: NR increases if PHF<PHF0, NR decreases if PHF>PHF0, otherwise NR is constant.

The comparator 12 produces the number NR, at N serial outputs, in the form of binary clock signals S(1) to S(N) representing the number NR. In the example of FIGS. 1 and 2, $N=2^{N0}$ and the signals S(1) to S(N) indicate the value of the number NR: S(NR+1)=1, and S(i)=0 for all values of i ranging from 1 to N and i≠NR+1. In another example, N=N0 and the signals S(1) to S(N) correspond to N bits of the number NR.

The digital comparator 20 receives the binary signals S(1) to S(N) and produces the clock signal CKHF at the output OUT. It conventionally includes an odd number of inverters serially connected to form a chain. The period of the signal CKHF obtained depends primarily on the number of inverters and the propagation time of a 0 and a 1 in each inverter.

An exemplary oscillator 20 is shown in FIG. 2. It has N cells C(1) to C(N) each comprising two inputs a, b and two outputs c, d. The N cells are series connected. The inputs a, b of the cells C(1) to C(N−1) are connected to the outputs c, d of the cells C(2) to C(N). The outputs c, d of the cell C(1) are connected together and form the output OUT of the oscillator 20. The switches INTC(1) to INTC(N) are connected between the inputs a, b of each cell C(1) to C(N). The switches INTC(1) to INTC(N) are controlled by the signals S(1) to S(N). They are closed when the signals S(1) to S(N) are active.

The cells C(2) to C(N) are identical. Each cell has an even number NC of inverters series connected between the input a and the output c and/or between the input b and the output d. Time periods TC0, TC1, possibly different from one another, are needed to propagate a 0 and a 1 respectively in all the elements of a cell C(2) to C(N), especially all the inverters.

The cell C(1) has a number NC' of inverters series connected between the input a and the output b and/or the input c and the output d of the cell C(1). The number NC' is an odd number to obtain the oscillations of the chain of inverters. Time periods TC0', TC1', possibly different from one another, are needed to propagate a 0 and a 1 respectively in all the elements of the cell C(1), especially all the inverters.

The clock-signal generator 10 operates as follows. The comparator gives a number NR0 ranging from 0 to $2^{N0}-1$ in the form of the corresponding signals S(1) to S(N). In the example of FIGS. 1 and 2, S(NR0+1)=1 and S(i)=0 for i ranging from 1 to N, and i≠NR0+1. The switches INTC(1) to INTC(N) open and close as a function of the signals S(1) to S(N). The cells C(NR0+2) to C(N) are isolated and the cells C(1) to C(NR0+1) form a chain comprising an add total number of series connected inverters.

The propagation time of a 0 or a 1 between the cell C(NR0+1) and the cell C(1) depends on the propagation time in each cell. The oscillator 20 gives a signal CKHF at its output OUT. The period of this signal CKHF is equal to PHF=(TC0+TC1)*NR+(TC0'+TC1') if the propagation time in the switch INTC(NR0+1) is overlooked. The period PHF is therefore proportional to the number NR given by the comparator.

If the period PHF of the clock signal CKHF obtained is smaller than the period desired PHF0, then the comparator increases the number NR to increase the number of cells in the chain, and thus increase the period of the signal CKHF. Conversely, if the period PHF of the signal CKHF obtained is greater than the desired value, then the number NR is reduced to reduce the period of the signal CKHF.

The number NR will thus vary gradually until the desired period PHF0 is reached. The amplitude of the variations of NR is modulated as a function of the difference between the real period PHF of the signal CKHF and the desired period. Thus, when the generator 10 starts working, the period PHF is small, far smaller than PHF0 and the comparator will vary the number NR substantially (+10, +50, +100 if necessary) to greatly increase the period PHF. Conversely, when PHF is close to PHF0, the number NR varies in smaller proportions (+1, −1) to obtain PHF=PHF0.

When NR increases or decreases by 1 respectively, a cell C is added or eliminated respectively in the chain. The minimum variation of the period in the oscillator is therefore equal to TC0+TC1, namely to the sum of the propagation times of a 0 and of a 1 in a cell C. The uncertainty over the period that defines the precision of the oscillator 20 is equal to P0=TC0+TC1.

The precision of the oscillator thus depends on the propagation times TC0, TC1 in the cells C(2) to C(N), namely the number of inverters NC contained in these cells and the switching times t0, t1 of these inverters. To improve the precision of the oscillator, it is possible to limit the number of inverters in a cell to NC=2 (the minimum) and/or to reduce the switching times of the inverters.

An inverter generally includes a P-type transistor and an N-type transistor that are series connected. The source of the P-type transistor is connected to a supply VDD and the source of the N-type transistor is connected to ground of the circuit. The gates of the transistors are connected together and form the input of the inverter. The drains of the transistors are connected together and form the output of the inverter.

The switching time of an inverter of this kind is proportional to $L^2$, with L being the length of the gate of the transistors. To reduce the switching times, it is necessary to reduce the gate length L of the transistors. However, the gate length L of the transistors cannot be reduced beyond a minimum length Lmin which depends on the technology chosen to make the integrated circuit. Beyond this limit Lmin, it is no longer possible to make the transistors. The switching time t0, t1 of the inverters therefore cannot be reduced beyond the minimum value t0 min, t1 min.

Consequently, the propagation times TC0, TC1 in the cells C(2) to C(N) are themselves limited by these minimum values. This approach is therefore not sufficient especially if it is required that the uncertainty with regard to the period of the signal CKHF obtained should be very low, for example 1%. The term uncertainty must be understood to mean the maximum variation in period of the signal CKHF when the number NR varies by 1.

SUMMARY OF THE INVENTION

In view of the foregoing background, an object of the invention is to provide an oscillator that is different and, in particular, precise, and to provide a clock-signal generator that uses this oscillator. The generator of the invention provides clock signals CKHF with a frequency of about 50 MHZ from a signal with a frequency of about 1 KHz, with an uncertainty of less than 1%.

The invention also relates to a generator comprising an oscillator producing a clock signal from an N-bit control number, with N being an integer greater than 1.

These and other objects, advantages and features according to the invention are provided by an oscillator comprising a first group of cells, and a second group of cells. Each cell in the first group of cells comprises at least one series connected inverter, and first selection means to select a variable number of cells of the first group of cells as a function of NH0 most significant bits of the control number. Each cell in the second group of cells comprises at least one series connected inverter and second selection means to select one of the cells of the second group of cells as a function of NL0 least significant bits of the control number. The cells of the first group and the cells of the second group are series connected to form a chain of inverters.

According to a preferred embodiment, each cell of the second group of cells is assigned a place value j ranging from 1 to NL, with NL being an integer from 1 to N. The second selection means comprises NL switches controlled by signals representing NL0 least significant bits of the control number. Each switch with a place value j is series connected with a cell having the same place value j belonging to the second group of cells between an input point and an output point.

Two different cells of the second group of cells have different propagation times for a 0 and a 1. Preferably, the difference between the propagation time of a 0 and a 1 in a cell with a place value j of the second group of cells and that of a cell with a place value j−1 is smaller than the relative uncertainty sought for the period of the clock signal obtained.

When the control number increases by 1, a cell with a place value j of the second group is selected. This selected cell is the cell with the place value immediately higher than that of a previously selected cell, or the cell with a lower place value, and an additional cell of the first group of cells in this case is also selected. The period of the clock signal thus follows the variations of the control number.

The generator according to the invention may also comprise a comparator to compare the period of the clock signal with a desired period, and give the control number in the form of N logic signals. The control number varies as follows. The control number increases if the period of the clock signal is smaller than the desired period. The control number decreases if the period of the clock signal is greater than the desired period. Otherwise, the control number is constant. Thus, when the control number increases or decreases respectively, then the period of the clock signal increases and decreases respectively.

According to the preferred embodiment, the generator also has a first decoder to decode the NL0 least significant bits of the control number for providing a first set of $NL=2^{NL0}$ control signals to the second selection means. These control signals have the following properties. SDL (j)=1 if j=NRL+1 for any value of j ranging from 1 to NL, with NRL corresponding to the decimal value of the NL0 least significant bits of the control number.

The generator may also but not necessarily comprise a second decoder to decode the NH0 most significant bits of the control number, and give the first selection means a second set of $NH=2^{NH0}$ control signals having the following properties. SDH(i)=1 if i=NRH+1 for any value of i ranging from 1 to NH, with NRH corresponding to the decimal value of the NH0 most significant bits of the control number.

A generator according to the invention may be improved by adding a control circuit to verify the following inequality: $0 \leq (TC0+TC1)+(TD0(1)+TD1(1))-(TD0(NL)+TD1(NL))$. TC0+TC1 is the propagation time of a 0 and a 1 in a cell of the first group of cells. TD0(1)+TD1(1) is the propagation time of a 0 and a 1 in the least significant cell of the second group of cells. TD0(NL)+TD1(NL) is the propagation time of a 0 and a 1 in the most significant cell of the second group of cells. The control circuit produces a control signal if the inequality is not verified, and the comparator increases the control number by one unit when it receives the control signal.

According to one embodiment of the control circuit, it comprises a reference oscillator to produce a clock signal with a reference period proportional to (TC0+TC1)+(TD0(1)+TD1(1)), and a measurement oscillator to produce a clock signal having a measured period proportional to (TD0(NL)+TD1(NL)). A comparison circuit compares the measured period with a reference period, and gives the active control signal if the measured period is smaller than the reference period.

BRIEF DESCRIPTION OF THE DRAWINGS

The invention will be understood more clearly and other features and advantages will appear from the following description, made with reference to the appended drawings in which.

DETAILED DESCRIPTION OF THE PREFERRED EMBODIMENTS

Figure 1:
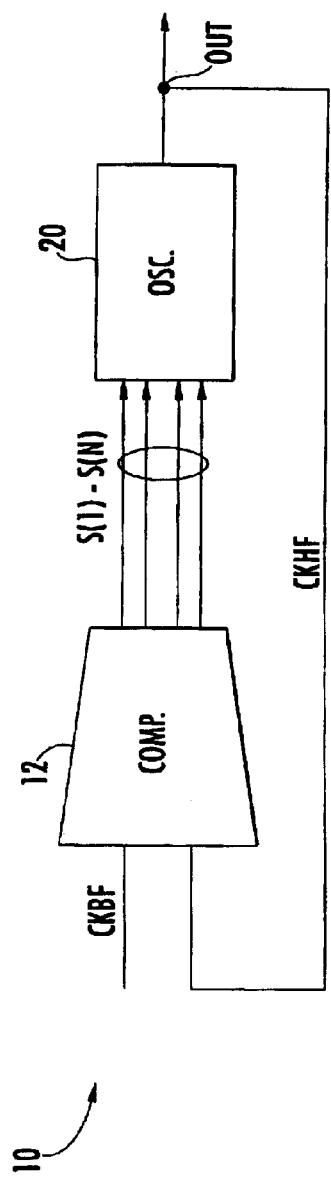
FIG. 1 is a functional block diagram of a clock-signal generator according to the prior art.
Figure 2:
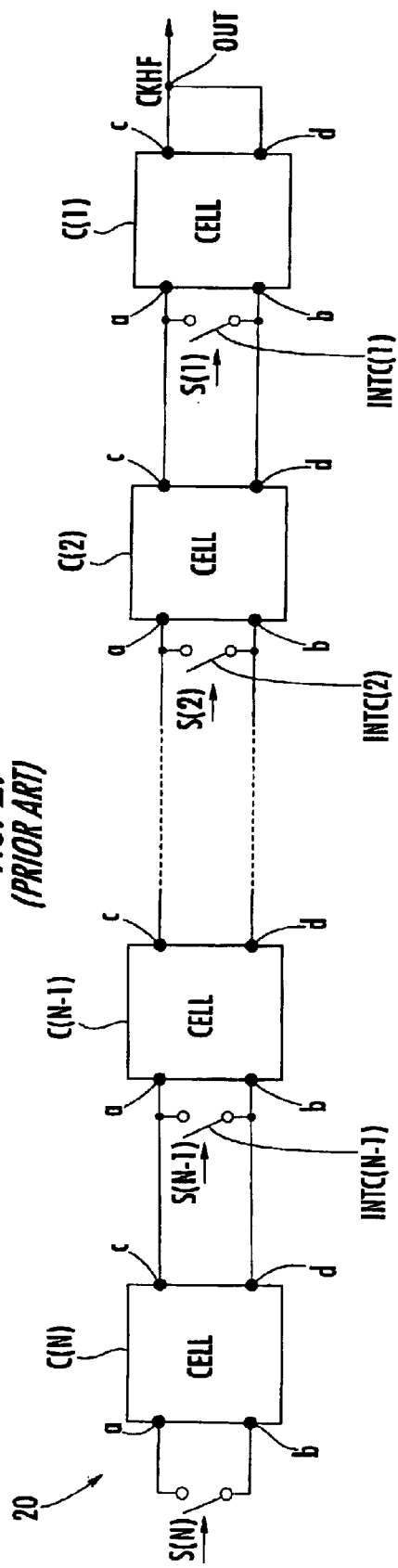
FIG. 2 is a functional block diagram of the oscillator illustrated in FIG. 1.
Figure 3:
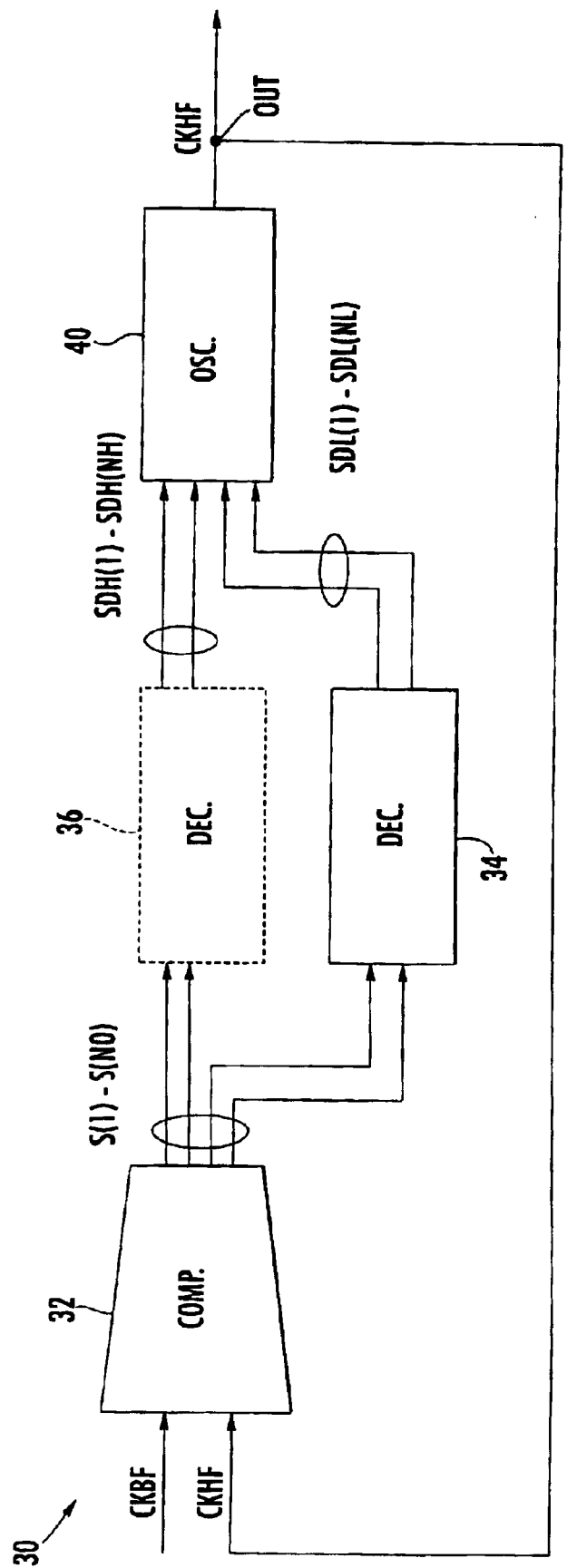
FIG. 3 is a functional block diagram of a clock signal generator according to the invention.

FIG. 3 is a functional diagram of a generator 30 according to the invention comprising a comparator 32, two decoders 34, 36 of binary signals and an oscillator 40. The generator 40 produces a high-frequency clock signal CKHF with a period PHF from a low-frequency reference signal CKBF having a period PBF.

The comparator 32 is identical to the comparator 12 and operates similarly. It has two inputs to which the signals CKHF and CKBF are applied. The comparator 32 compares the period PHF of the signal CKHF with a desired period PHF0. The desired period is, for example, a multiple of the period PBF of the reference signal CKBF. The comparator 12 gives the result of the comparison obtained in the form of a binary number NR with N0 bits having the following characteristics: NR increases if PHF<PHF0, NR decreases if PHF>PHF0, otherwise NR is constant. The binary number NR is produced on N0 serial outputs in the form of binary signals S(1) to S(N0).

The decoder 34 receives the signals S(1) to S(NL0) corresponding to the word NRL. The word NRL corresponds to the NL0 least significant bits of the number NR. The decoder 34 produces $NL=2^{NL0}$ logic signals SDL(1) to SDL(NL) which indicate the decimal value of the word NRL: SDL(NRL+1)=1, and SDL(i)=0 for any value of i ranging from 1 to NL and i≠NRL+1.

The decoder 36 receives the signals S(N-NH0) to S(N) corresponding to the word NRH. The word NRH corresponds to the NH0 most significant bits of the number NR, with NH0 being equal to NH0=N−NL0. The decoder 36 produces $NH=2^{NH0}$ logic signals SDH(1) to SDH(NH) that indicate the decimal value of the word NRH: SDH(NRH+1)=1, and SDH(j)=0 for any value of j ranging from 1 to NH and j≠NRH+1.

The decoders 34, 36 are made similarly according to known diagrams. They include a set of logic gates whose number is a function of the number of signals received at their input.

The oscillator 40 receives, at NH+NL serial inputs, the signals SDL(1) to SDL(NL), SDH(1) to SDH(NH) and produces the clock signal CKHF at an output OUT that is also connected to an input of the comparator 32.

Figure 4:
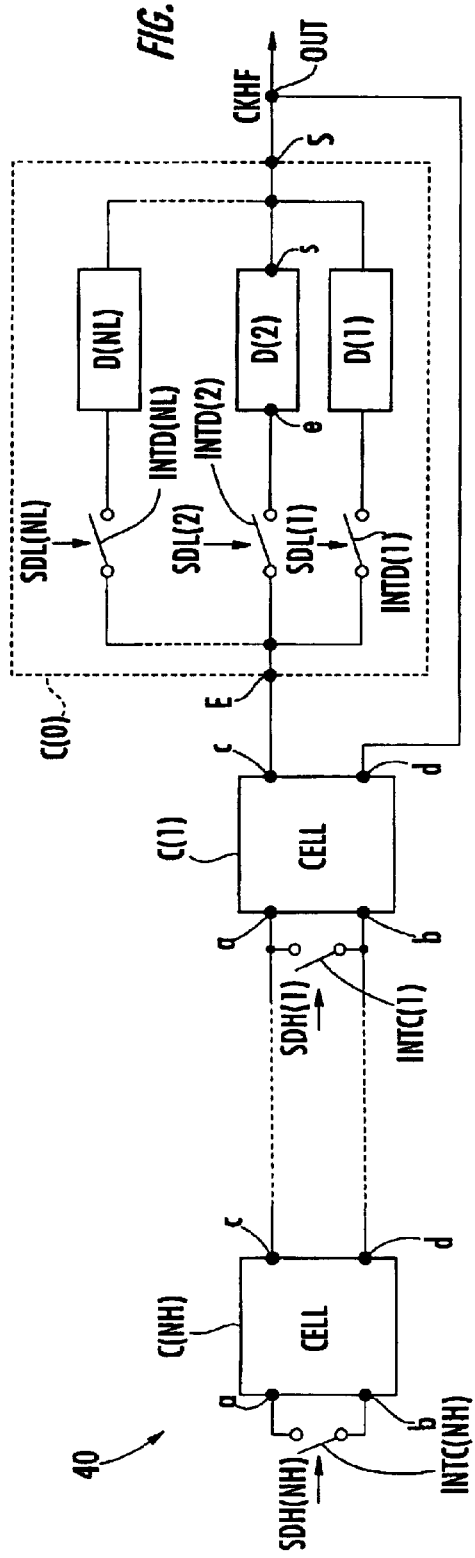
FIG. 4 is a functional block diagram of the oscillator illustrated in FIG. 3.

The oscillator 40 is described in detail in FIG. 4. It has NH cells C(1) to C(NH) that are series connected. Each cell has two inputs a, b and two outputs c, d. The inputs a, b of the cells C(1) to C(NH−1) are connected to the outputs c, d of the cells C(2) to C(NH), and the output d of the cell C(1) is connected to an output OUT of the oscillator 40. Switches INTC(1) to INTC(NH) are connected between the inputs a and b of the cells C(1) to C(NH). They are controlled by the signals SDH(1) to SDH(NH). The switches INTC(1) to INTC(NH) are closed when the signals SDH(1) to SDH(NH) are active. Otherwise the switches INTC(1) to INTC(NH) are open.

The oscillator 40 also has a cell C(0) having an input E and an output S series connected between the output c of the cell C(1) and the output OUT of the oscillator 40. The cells C(2) to C(NH) are identical. Each cell comprises an even number NC of inverters series connected between its input a and its output c and/or between its input b and its output d. The cells C(2) to C(NH) have propagation times TC0, TC1 that may be different from one another.

The cell C(1) has an odd number NC' of inverters series connected between its input a and its output c and/or between its input b and its output d. The cell C(0) has NL arms parallel connected between the input E and the output S of the cell C(0). Each arm has the following, series connected. A switch INTD(1) to INTD(NL) controlled by the signal SDL(1) to SDL(NL). This switch is closed when the interrupter signal is active. A cell D(1) to D(NL) comprises an even number ND of series connected inverters between an input e and an output s.

Thus, for the special values of the signals SDL(1) to SDL(NL), SDH(1) to SDH(NH), the cell C(1), a variable number of cells C(2) to C(NH) and a cell D are selected to form a chain of cells in the oscillator 40. The total number of series connected inverters in the chain is an odd number since NC, ND are even numbers and NC' is an odd number. This enables the oscillation and generation of the signal CKHF.

Alternative embodiments of the oscillator 40 may be planned. The oscillator 40 is obtained by adding the cell C(0) in the known oscillator 20. The cell C(0) is added in series with the others. In the example of FIG. 4, it is placed between the cell C(1) and the output OUT of the oscillator.

The cell C(0) could easily be shifted and be series connected, for example, between an input and an output of two adjacent cells C(2) to C(NH). The cell C(0) may be added in the same way to any type of known oscillator that uses a set of series connected inverters to produce a signal CKHF whose period is proportional to the number of selected inverters.

In the oscillator 40, the cells C(2) to C(NH) comprise an even number NC of inverters, the cell C(1) comprises an odd number NC' of inverters and the cells D(1) to D(NH) each comprise an even number ND of inverters. These choices of NC, NC', ND make it possible, regardless the value of the number NR given by the comparator, to ensure that the total number of series connected inverters in the chain is an odd number. This condition is necessary to obtain oscillations.

However, other choices of NC, ND, NC' may be made. For example, it is possible to choose NC' as an even number and ND as an odd number. In this case, preferably, a cell C(1) identical to the cells C(2) to C(NH) is used. It is also necessary, if ND is chosen as an odd number, to take account of the difference between the propagation times of a 0 and a 1 in the cells D in order to size them properly.

In the oscillator 40, the cells C(2) to C(NH) are selected from signals SDH(1) to SDH(NL) obtained by the decoding of the most significant bits of the number NR given by the comparator. However, if an oscillator according to the invention is made out of cells C(1), C(NH0) directly using the signals S(N-NH0) to S(N) corresponding to the most significant bits of NR, then the decoder 36 is of course eliminated.

The cells D(1) to D(NL) all have the same number of series connected inverters ND, and in each cell the inverters are identical. Since ND is an even number, the propagation time of a 0 or a 1 are identical in the same cell D(j): TD0(j)=TD1(j)=TD(j).

The inverters, however, are different from one cell D to another. There are different switching times from one cell D to another. The switching time of the cells D verify the following inequalities:

$$0 \leq 2*(TD(2)-TD(1)) \leq \Delta P$$

$$0 \leq 2*(TD(3)-TD(2)) \leq \Delta P$$

$$0 \leq 2*(TD(NL)-TD(NL-1)) \leq \Delta P$$

$$0 \leq (TC0+TC1)+2*(TD(1)-TD(NL)) \leq \Delta P$$

TD(j) is the propagation time of a 0 or a 1 in the cell D(j), and ΔP is the uncertainty sought for the period PHF of the high-frequency signal produced by the oscillator. In other words, ΔP is the maximum variation desired by the period PFH of the signal CKHF when NR varies by 1.

The cells D(1) to D(NL) are not necessarily very fast. They may even have greater propagation times than those of the cells C(1) to C(NH). This facilitates their fabrication. On the contrary, what is important is that the difference between the propagation times of the two adjacent cells D should be small. That is, the inequalities described above should be verified.

In practice, to make the cells D, inverters having gates with different lengths from one cell to another are used. The switching time of the inverters are proportional to $L^2$, with L being the gate length of the inverters. The inverters with the smallest gate length are therefore used to make the cell D(1), and the inverters with the largest gate length are used to make the cell D(NL).

Operation of the oscillator 40 is similar to that of the oscillator 20. In the following example, it is assumed that N=5, NL0=2 and NH0=3. The oscillator 40 therefore has NH=$2^{NH0}$=8 cells C(1) to C(8) and its cell C(0) comprises NL=$2^{NL0}$=4 cells D(1) to D(4). It is assumed, furthermore, that the comparator 32 of the generator 30 produces the binary number NR0=01010 and that the period PHF is smaller than its desired value.

The circuit 36 decodes the number NRH=010 corresponding to the NH0 most significant bits of NR, and it gives the active signal SDH(3)=1 for enabling the selection of the components C(1) to C(3). The signals SDH(1), SDH(2), SDH(4) to SDH(8) are inactive, and equal to 0.

The circuit 34 decodes the number NRL=10 corresponding to the NL0 2 least significant bits of NR, and it gives an active signal SDL(3)=1 enabling the selection of the cell D(3). The signals SDL(1), SDL(2), SDL(4) are inactive, and equal to 0. The period PHF of the signal CKHF obtained is equal to 2*(TC0+TC1)+(TC0'+TC1')+2*TD(3).

If NR increases by 1, then NR=NR0+1=01011. NRH=010 is identical, and the components C(1) to C(3) are selected. However, the decoding of the number NRL=11 gives the active signal SDL(4)=1 used to select the cell D(4). Since the propagation time TD(4) of the cell D(4) is greater than the propagation time TD(3) of the cell D(3), the period increases. Furthermore, the variation in the period is smaller than $\Delta P$ because 2*(TD(4)−TD(3))≦$\Delta P$.

If NR furthermore increases by 1, then NR=01100. NRH=011 is modified and its decoding gives the signal SD2(4)=1 used to select the components C(1) to C(4). The number NRL=00 is also modified and its decoding gives the signal SDL(1)=1 to select the cell D(1). An additional cell C and the cell D(1) are thus added in the chain. Since (TC0+TC1)+2*(TD(1)−TD(4))≦$\Delta P$, the period increases and the variation in period is below $\Delta P$. Thus, if NR increases, then the period PHF increases accordingly. Conversely, if NR decreases, then the period PHF decreases accordingly.

The overall operation of the generator 30 is similar to that of the generator 10. The comparator modifies the number NR according to the difference between the period PHF and its desired value PHF0. For example, if during the starting of the generator the period PHF is small, far smaller than its desired value, then the comparator increases the number NR substantially (+5, +50, +100) to increase the period PHF accordingly.

In another example, if during the starting of the generator the period PHF is large, far lager than its desired value, then the comparator reduces the number NR substantially (−5, −50, −100) to increase the period PHF accordingly. However, when the period PHF is close to its desired value PHF0, then the amplitude of the variations of the number NR varies in smaller proportions (+2, −1, +1).

Compared with the oscillator 20, the oscillator 40 of the invention is far more precise because the uncertainty with regard to the period PHF of the signal CKHF obtained is very small. The term "uncertainty" must be understood to mean the maximum variation in the period of the signal CKHF when the number NR varies by 1.

The uncertainty on the period PHF of the signal CKHF obtained is equal to the difference between the propagation times of a 0 and a 1 in two adjacent cells D. The uncertainty is therefore equal to $\Delta P$.

Compared with the uncertainty $\Delta P0$ on the period of the signal CKHF given by the prior art oscillator 20, the uncertainty $\Delta P$ of the oscillator 40 is in the range of $\Delta P = \Delta P0/2^{NL0}$. In the example described above, the uncertainty is thus divided by 4. The precision of the oscillator 40 is therefore better than that of the oscillator 20.

If the precision desired for the generator is very strict, namely if the uncertainty $\Delta P$ desired for the period of the clock signal CKHF is very low, then it is necessary to choose a number NH0 that it very high. In other words, it is necessary to choose a cell C(0) comprising a large number of cells D.

As seen above, the switching time of the inverters of a cell are proportional to $L^2$, with L being the gate length of the transistors forming the inverters. The inverters with the smallest gate length are used to make the cell D(1) and the inverters with the largest gate length are used to make the cell D(NL).

However, the variations in the manufacturing method of the integrated circuit provide a lack of precision $\Delta L$ on the gate length of all the transistors. $\Delta L$ is constant for all the transistors of the same integrated circuit. The lack of precision $\Delta L$ obviously leads to uncertainty on the switching time of the inverters, and therefore on the propagation time in the cells D(1) to D(NL).

In very unfavorable conditions, it is then possible that the following inequality will no longer be met:

$$0 \leq (TC0+TC1)+2*(TD(1)-TD(NL)) \quad \text{(eq. NL)}$$

Thus, it is no longer possible to ensure that the period PHF of the signal CKHF produced by the oscillator 40 will increase and decrease respectively when the number NR increases and decreases respectively. Consequently, the desired precision $\Delta P$ can no longer be reached.

This problem appears clearly in the following example. It is assumed that N=5, NL0=2 and NH0=3. The oscillator 40 therefore comprises NH=$2^{NH0}$=8 components C(1) to C(8) and NL=$2^{NL0}$=4 cells H(1) to H(4). It is also assumed that the comparator 32 produces the binary number NR0=01010. Finally it is assumed that 2*TD(4) is greater than TC0+TD0+2*TD(1).

For NR=NR0=01010, the cell D(3) and the cells C(1) to C(3) are selected. The period PHF is equal to PHF=2*(TC0+TC1)+(TC0'+TC1')+2*TD(3). When NR is increased by 1, NR=NR0+1=01011, and the cell D(4) and the cells C(1) to C(3) are selected. The period of the signal CKHF obtained therefore increases since the propagation time TD(4) in the cell D(4) is greater than the propagation time TD(3) in the cell D(3). The increase in the period is smaller than $\Delta P$.

When NR is again increased by 1, NR=NR0+1=01100. The cell D(1) and the cells C(1) to C(4) are selected. Since 2*TD(4) is greater than TC0+TC1+2TD(1), the period of the signal CKHF obtained falls whereas it should have increased with NR.

Figure 5:
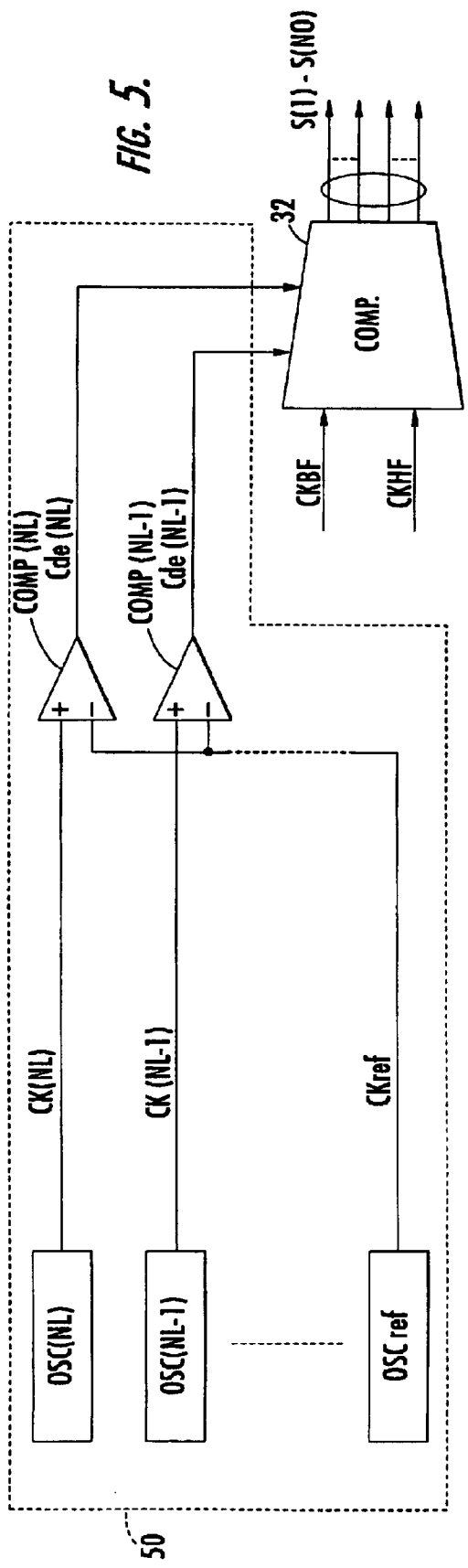
FIG. 5 is a functional block diagram of a control circuit connected to the comparator illustrated in FIG. 3.

FIG. 5 shows a possible improvement of the clock-signal generator of FIG. 4 that eliminates the problems mentioned above, and further improves the precision of the clock signal CKHF produced by the generator. FIG. 5 shows a control circuit 50 which determines if the inequality (equation NL) referred to above is met and, if necessary, gives a control signal to drive the comparator 32.

The control circuit 50 has a reference oscillator OSCref, an oscillator OSC(NL) and a comparator COMP(NL). The oscillator OSCref gives a clock signal CKref whose period is equal to:

PCKref=X*((TC0+TC1)+2*TD(1)), with X being an integer.

The oscillator OSCref is obtained by associating the following in series in a loop: a cell F and X packets of cells. The input of the first packet is connected to the output of the second packet, . . . , the input of X-1$^{th}$ packet is connected to the output of the X$^{th}$ packet, and the input of the X$^{th}$ packet is associated with the output of the cell F whose input is connected to the output of the first packet. Each packet has a cell identical to the cells C(2) to C(NH) of the oscillator 40 and a cell D(1). These two cells are series connected. The signal CKref is, for example, given at the output of the first packet.

The cell F is a cell comprising an odd number, for example, equal to 1, of series connected inverters. The cell F is necessary because the cells C(2) to C(NH) and the cell D(1) comprise an even number of series connected inverters. The oscillations therefore are not possible without the cell F. Furthermore, if X is large, then the propagation time of a 0 and a 1 in a cell F has little influence on the period PCKref. They have been neglected.

The oscillator OSC(NL) for its part gives a clock signal CK(NL) whose period is equal to: PCK(NL)=X*2*TD(NL). The oscillator OSC(NL) is similar to the oscillator OSCref. It has a cell F and X packets of cells. Each packet comprises a cell D(NL) identical to that of the oscillator 40. The input of the first packet is connected to the output of the second packet, . . . ,the input of the X-1$^{th}$ packet is connected to the output of the X$^{th}$ packet, and the input of the X$^{th}$ packet is connected to the output of the cell F whose input is connected to the output of the first packet. The signal CK(NL) is produced, for example, on an output of the first packet.

The comparator COMP(NL) has two inputs to which the signals CK(NL) and CKref are applied. The comparator compares the period PCK(NL) with the period of the signal CKref, and gives the comparator 32 a control signal Cde(NL) which has the following characteristics: Cde(NL) is active if PCK(NL)>PCKref, that is, if the following inequality is no longer verified:

$$0 \leq (TC0+TC1)+2*(TD(1)-TD(NL)) \qquad \text{(eq. NL)}$$

Otherwise, Cde(NL) is inactive. When it receives the signal Cde(NL), the comparator 32 increments the number NR by 1. This increase by 1 is added, as the case may be, to other increases of the number NR provided by other means and arising out of the difference between the period PHF and its desired value.

The following example shows the value and operation of the generator 30 using the oscillator 40 and the control circuit 50. The same assumptions as in the previous example are maintained. In particular, 2*TD(4) is greater than TC0+TC1+TD(1). For NR=NR0=01010, the cell D(3) and the cells C(1) to C(3) are selected.

Since TD(4)>TC0+TC1+TD(1), the signal Cde(4) is active and NR is increased by 2 instead of 1. The signal NR therefore directly takes the value 01100, the cell D(1) and the cells C(1) to C(3) are selected and the period increases. The cell C(4) is finally not selected. It is simply avoided.

The control circuit 50 can be improved by adding an oscillator OSC(NL-1) and a comparator COMP(NL-1) similar to the elements OSC(NL) and COMP(NL). This verifies the following inequality:

$$0 \leq (TC0+TC1)+2*(TD(1)-TD(NL-1)) \qquad \text{(eq. NL-1)}$$

The oscillator OSC(NL-1) gives a clock signal CK(NL-1) whose period is equal to: PCK(NL)=X*2*TD(NL-1). The oscillator OSC(NL-1) is similar to the oscillator OSC(NL). It comprises a cell F and X packets of cells, with each packet comprising a cell D(NL-1) identical to that of the oscillator 40.

The comparator COMP(NL-1) has two inputs to which the signals CK(NL-1) and CKref are applied. The comparator compares the period PCK(NL-1) with the period of the signal CKref and gives the comparator 32 a control signal Cde(NL-1) which has the following characteristics: Cde(NL-1) is active if PCK(NL-1)>PCKref, namely if the inequality (NL-1) is not verified, otherwise Cde(NL-1) is inactive.

When it receives the signal Cde(NL-1), the comparator 32 increases the number NR by 1. This increase by one unit is added to the increase by one unit due to the control signal Cde(NL) and, as the case may be, to other increases provided in other ways and caused by the difference between the period PHF and its desired value. Thus, if the signal Cde(NL-1) is active, then the cells D(NL) and D(NL-1) are not selected if NR increases. They are quite simply avoided.

Of course, if necessary, it is possible to add other oscillators OSC(NL-2) to OSC(1) and associated comparators COMP(NL-2) to COMP(1) to verify all the inequalities pertaining to the cells D(1) to D(NL-2):

$$0 \leq (TC0+TC1)+2*(TD(1)-TD(NL-2)) \qquad \text{(eq. NL-2)}$$

$$0 \leq (TC0+TC1)+2*(TD(1)-TD(NL-3)) \qquad \text{(eq. NL-3)}$$

. . .

$$0 \leq (TC0+TC1)+2*(TD(1)-TD(2)) \qquad \text{(eq. 2)}$$

According to one variation, the signal Cde(NL) is produced and taken into account by the comparator 32 only if the cell D(NL-1) is selected. In this case, the oscillator OSC(NL) and the comparator COMP(NL) are activated whenever the cell D(NL-1) is selected. The signal Cde(NL-1) is produced similarly. It is produced and taken into account by the comparator 32 only if the cell D(NL-2) is selected.

In another variation, the oscillator OSC(NL) and the comparator COMP(NL) are activated at the starting of the oscillator, and the signal Cde(NL), active or inactive, is memorized. The comparator 32 is then taken into account only if the cell D(NL-1) is selected. The signal Cde(NL-1) is produced similarly. It is produced when the oscillator starts, and is memorized. It is then taken into account only when the cell D(NL-2) is selected. This variation is advantageous because it consumes less energy than the previous one. Indeed, the oscillator OSC(NL) and the comparator COMP(NL) can be deactivated as soon as the signal Cde(NL) is memorized.

Preferably, the associated oscillator OSC(NL-1) and comparator COMP(NL-1) are used (either when starting or whenever the cell D(NL-2) is selected) only if the signal Cde(NL) is active. This further limits the consumption of the circuit.

That which is claimed is:

1. A signal generator comprising:
    an oscillator for providing an output signal from an N-bit control number, with N being an integer greater than 1, said oscillator comprising
        a first group of cells, each cell comprising at least one inverter,
        a first selection circuit connected to said first group of cells for selecting a number of cells as a function of predetermined most significant bits of the N-bit control number,
a second group of cells connected in parallel to one another, each cell comprising at least one inverter, and
a second selection circuit connected to said second group of cells for selecting one of the cells within said second group of cells as a function of predetermined least significant bits of the N-bit control number,
selected cells of said first and second groups being connected in series to form a chain of inverters.

2. A signal generator according to claim 1, wherein each cell within said second group of cells is assigned a place value j ranging from 1 to NL.

3. A signal generator according to claim 2, wherein said second selection circuit comprises NL switches controlled by signals representing the least significant bits of the N-bit control number, each switch being series connected with a cell having a same place value j between an input and an output of the second group of cells.

4. A signal generator according to claim 1, wherein two different cells within said second group of cells have different propagation times for a first logic value and a second logic value.

5. A signal generator according to claim 2, wherein a difference between a propagation time of a first logic value and a second logic value in a cell within said second group of cells having a place value j and that of a cell within said second group of cells having a place value j-1 is less than a desired uncertainty for a period of the output signal.

6. A signal generator according to claim 2, wherein when the N-bit control number increases by 1, a cell within said second group of cells with a place value j is selected, this selected cell being at least one of a cell having a place value immediately higher than that of a previously selected cell within said second group of cells, and a cell with a lower place value, with an additional cell within said first group of cells also being selected.

7. A signal generator according to claim 1, further comprising a comparator for comparing a period of the output signal with a desired period for providing the N-bit control number in the form of N logic signals, with the N-bit control number increasing if the period of the output signal is less than the desired period, decreasing if the period of the output signal is larger than the desired period, and remaining constant otherwise.

8. A signal generator according to claim 2, further comprising a first decoder for decoding the least significant bits NL0 of the N-bit control number and for providing a first set NL=$2^{NL0}$ of control signals (SDL(1) to SDL(NL)) to said second selection circuit, this first set of control signals having the following properties: SDL(j)=1 if j=NRL+1 for any value of j ranging from 1 to NL, with NRL corresponding to a decimal value of the NL0 least significant bits of the N-bit control number.

9. A signal generator according to claim 8, further comprising a second decoder for decoding the most significant bits NH0 of the N-bit control number and for providing said first selection circuit a second set NH=$2^{NH0}$ of control signals (SDH(1) to SDH(NH)), this second set of control signals having the following properties: SDH(i)=1 if i=NRH+1 for any value of i ranging from 1 to NH, with NRH corresponding to a decimal value of the NH0 most significant bits of the N-bit control number.

10. A signal generator according to claim 1, further comprising a control circuit for verifying the following inequality and producing a first control signal if the inequality is not verified:

$$0 \leq (TC0+TC1)+(TD0(1)+TD1(1))-(TD0(NL)+TD1(NL))$$

wherein:
TC0+TC1 is a propagation time of a first logic value and a second logic value in a cell within said first group of cells,
TD0(1)+TD1(1) is a propagation time of a first logic value and a second logic value in a least significant cell within said second group of cells, and
TD0(NL)+TD1(NL) is a propagation time of a first logic value and a second logic value in a most significant cell within said second group of cells.

11. A signal generator according to claim 10, wherein said control circuit comprises:
a reference oscillator for providing a signal with a reference period proportional to (TC0+TC1)+(TD0(1)+TD1(1));
a first measurement oscillator for providing a signal having a measured period proportional to (TD0(NL)+TD1(NL)); and
a first comparison circuit for comparing the measured period with a reference period and for providing the first control signal if the measured period is smaller than the reference period.

12. A signal generator according to claim 10, further comprising a comparator for comparing a period of the output signal with a desired period for providing the N-bit control number in the form of N logic signals, and said comparator increases the N-bit control number by one unit when the control signal is received.

13. A signal generator according to claim 11, wherein said control circuit further comprises:
a second measurement oscillator for providing a signal having a second measured period proportional to (TD0(NL-1)-TD1(NL-1)); and
a second comparison circuit for comparing a second period with the reference period, and for providing a second control signal if the measured period is less than the reference period.

14. A signal generator according to claim 13, wherein said control circuit is activated when said oscillator starts to operate, and at least one of the first and second control signals is memorized.

15. A signal generator according to claim 14, wherein the first control signal is taken into account when the cell with the place value NL-1 within said second group of cells is selected.

16. A signal generator according to claim 14, wherein the second control signal is taken into account when the cell with the place value NL-2 within said second group of cells is selected.

17. A signal generator according to claim 14, wherein said control circuit is activated when the cell with the place value NL-1 within the second group of cells is selected.

18. A signal generator according to claim 14, wherein said control circuit is activated when the cell with the place value NL-2 within said second group of cells is selected.

19. A signal generator comprising:
a comparator for comparing a period of an output signal with a desired period for providing an N-bit control number;
a first decoder for decoding predetermined least significant bits of the N-bit control number and for providing a first set of control signals;

a second decoder for decoding predetermined most significant bits of the N-bit control number and for providing a second set of control signals; and an oscillator for providing the output signal from the N-bit control number, with N being an integer greater than 1, said oscillator comprising
- a first group of cells, each cell comprising at least one inverter,
- a first selection circuit connected to said first group of cells for selecting a number of cells based upon the second set of control signals, a second group of cells, each cell comprising at least one anverter, and
- a second selection circuit connected to said second group of cells for selecting one of the cells based upon the first set of control signals, each cell within said second group of cells being assigned a place value j ranging from 1 to NL,
- selected cells of said first and second groups of cells being connected in series to form a chain of inverters.

20. A signal generator according to claim 19, wherein said second selection circuit comprises NL switches controlled by the first set of control signals.

21. A signal generator according to claim 19, wherein two different cells within said second group of cells have different propagation times for a first logic value and a second logic value.

22. A signal generator according to claim 19, wherein the N-bit control number increases if the period of the output signal is less than the desired period, decreases if the period of the output signal is larger than the desired period, and remains constant otherwise.

23. A signal generator according to claim 19, further comprising a control circuit for verifying the following inequality and producing a first control signal if the inequality is not verified:

$$0 \leq (TC0+TC1)+(TD0(1)+TD1(1))-(TD0(NL)+TD1(NL))$$

wherein:
- TC0+TC1 is a propagation time of a first logic value and a second logic value in a cell within said first group of cells,
- TD0(1)–TD1(1) is a propagation time of a first logic value and a second logic value in a least significant cell within said second group of cells, and
- TD0(NL)+TD1(NL) is a propagation time of a first logic value and a second logic value in a most significant cell within said second group of cells.

24. A signal generator according to claim 23, wherein said control circuit comprises:
- a reference oscillator for providing a signal with a reference period proportional to (TC0+TC1)+(TD0(1)+TD1(1));
- a first measurement oscillator for providing a signal having a measured period proportional to (TD0(NL)+TD1(NL)); and
- a first comparison circuit for comparing the measured period with a reference period and for providing the first control signal if the measured period is smaller than the reference period.

25. A signal generator according to claim 24, wherein said control circuit further comprises:
- a second measurement oscillator for providing a signal having a second measured period proportional to (TD0(NL−1)+TD1(NL−1)); and
- a second comparison circuit for comparing a second period with the reference period, and for providing a second control signal if the measured period is less than the reference period.

26. An oscillator for providing an output signal from an N-bit control number, with N being an integer greater than 1, the oscillator comprising:
- a first group of cells, each cell comprising at least one inverter;
- a first selection circuit connected to said first group of cells for selecting a number of cells as a function of predetermined most significant bits of the N-bit control number;
- a second group of cells connected in parallel to one another, each cell comprising at least one inverter; and
- a second selection circuit connected to said second group of cells for selecting one of the cells as a function of predetermined least significant bits of the N-bit control number;
- the selected cells of said first and second groups being connected in series to form a chain of inverters.

27. An oscillator according to claim 26, wherein each cell within said second group of cells is assigned a place value j ranging from 1 to NL, and wherein said second selection circuit comprises NL switches controlled by signals representing the least significant bits of the N-bit control number, each switch for being connected in series between an input and an output of a cell having a same place value j.

28. An oscillator according to claim 26, wherein two different cells of said second group of cells have different propagation times for a first logic value and a second logic value.

29. An oscillator according to claim 26, wherein a difference between a propagation time of a first logic value and a second logic value in a cell within said second group of cells with a place value j and that of a cell within said second group of cells with a place value j−1 is less than a desired uncertainty for a period of the output signal.

30. An oscillator according to claim 26, wherein when the N-bit control number increases by 1, a cell within said second group of cells with a place value j is selected, this selected cell being at least one of a cell having a place value immediately higher than that of a previously selected cell within said second group of cells, and a cell with a lower place value, with an additional cell within said first group of cells also being selected.

31. A method for generating an output signal comprising:
- comparing a period of the output signal with a desired period for providing an N-bit control number;
- decoding least significant bits of the N-bit control number for providing a first set of control signals;
- decoding most significant bits of the N-bit control number for providing a second set of control signals; and
- providing the output signal based upon the N-bit control number, with N being an integer greater than 1, using an oscillator comprising a first group of cells, each cell comprising at least one inverter and a first selection circuit connected to the first group of cells, and a second group of cells, each cell comprising at least one inverter and a second selection circuit connected to the second group of cells, the providing comprising
  - selecting a number of cells within the first group of cells based upon the second set of control signals, and
  - selecting one of the cells within the second group of cells based upon the first set of control signals, the second group of cells being connected in parallel to one another, the selected cells of the first and second groups of cells being connected in series to form a chain of inverters.

32. A method according to claim 31, wherein each cell within the second group of cells is assigned a place value j ranging from 1 to NL, and wherein the second selection circuit comprises ML switches controlled by the first set of control signals.

33. A method according to claim 31, wherein two different cells within the second group of cells have different propagation times for a first logic value and a second logic value.

34. A method according to claim 31, wherein a difference between a propagation time of a first logic value and a second logic value in a cell within the second group of cells having a place value j and that of a cell within the second group of cells having a place value j-1 is less than a desired uncertainty for a period of the output signal.

35. A method according to claim 31, wherein when the N-bit control number increases by 1, a cell within the second group of cells having a place value j is selected, this selected cell being at least one of a cell having a place value immediately higher than that of a previously selected cell within the second group of cells, and a cell with a lower place value, with an additional cell within the first group of cells also being selected.

36. A method according to claim 31, wherein the N-bit control number increases if the period of the output signal is less than the desired period, decreases if the period of the output signal is larger than the desired period, and remains constant otherwise.

* * * * *

UNITED STATES PATENT AND TRADEMARK OFFICE
CERTIFICATE OF CORRECTION

PATENT NO. : 6,731,178 B2
DATED : May 4, 2004
INVENTOR(S) : Bruno Gailhard and Olivier Ferrand It is certified that error appears in the above-identified patent and that said Letters Patent is hereby corrected as shown below:

Column 7,
Line 38, delete "2*(TD(4)-TD(3)) $\leq \Delta P$" insert -- 2*(TD(4)-TD(3)) < $\Delta P$ --

Column 12,
Line 38, delete "(TD0(NL-1) - TD1(NL-1))" insert -- (TD0(NL-1)+TD1(NL-1)) --

Column 13,
Line 44, delete "TD0(1) - TD1(1)" insert -- TD0(1) + TD1(1) --

Column 15,
Line 7, delete "ML" insert -- NL --

Signed and Sealed this

Eighth Day of February, 2005

JON W. DUDAS
*Director of the United States Patent and Trademark Office*